United States Patent [19]

Zdebel

[11] Patent Number: 5,154,946
[45] Date of Patent: Oct. 13, 1992

[54] CMOS STRUCTURE FABRICATION

[75] Inventor: Peter J. Zdebel, St. Heinrich, Fed. Rep. of Germany

[73] Assignee: Motorola, Inc., Schaumburg, Ill.

[21] Appl. No.: 649,189

[22] Filed: Feb. 4, 1991

Related U.S. Application Data

[63] Continuation of Ser. No. 588,867, Sep. 27, 1990, abandoned.

[51] Int. Cl.$^5$ ............................................. J01L 21/336
[52] U.S. Cl. ........................................ 437/34; 357/42; 437/44; 437/57; 437/59
[58] Field of Search ................. 437/56, 34, 63, 44, 437/52, 59, 60; 352/42, 44

[56] References Cited

U.S. PATENT DOCUMENTS

| | | | |
|---|---|---|---|
| 4,426,766 | 1/1984 | Lee | 437/34 |
| 4,554,572 | 11/1985 | Chatterjee | 357/42 |
| 4,593,459 | 6/1986 | Poppert et al. | 437/62 |
| 4,690,730 | 9/1987 | Tang et al. | 357/23.9 |
| 4,713,329 | 12/1987 | Fang et al. | 437/34 |
| 4,729,964 | 3/1988 | Natsuaki et al. | 437/36 |
| 4,786,960 | 11/1988 | Jench | 357/42 |
| 4,816,423 | 3/1989 | Havemann | 437/34 |
| 4,862,240 | 8/1989 | Watanabe et al. | 357/44 |
| 4,876,213 | 10/1989 | Pfiester | 437/34 |
| 4,908,326 | 3/1990 | Ma et al. | 437/44 |
| 4,922,318 | 5/1990 | Thomas et al. | 357/42 |
| 5,021,356 | 6/1991 | Henderson et al. | 437/45 |

Primary Examiner—Olik Chaudhuri
Assistant Examiner—Long Pham
Attorney, Agent, or Firm—Harry A. Wolin

[57] ABSTRACT

A method of fabricating a CMOS structure that may be integrated into a BICMOS process flow includes forming N and P type doped wells in an isolation module. A first conformal nitride layer is formed on the surface of the isolation module and portions of the nitride layer disposed over the doped wells are removed. After forming a gate oxide layer on the doped wells, a conformal polysilicon layer is formed and doped on the surface of the structure. The conformal polysilicon layer is etched into gate electrodes which are used as a mask for the self-aligned implant of first portions of source and drain regions in the doped wells. Dielectric spacers abutting the edges of the gate electrodes are formed and the implantation of second portions of the source and drain regions is self-aligned to the dielectric spacers. Following the formation of a conformal nitride layer and a conformal oxide layer, the structure is planarized and source, drain and gate contacts are formed.

22 Claims, 2 Drawing Sheets

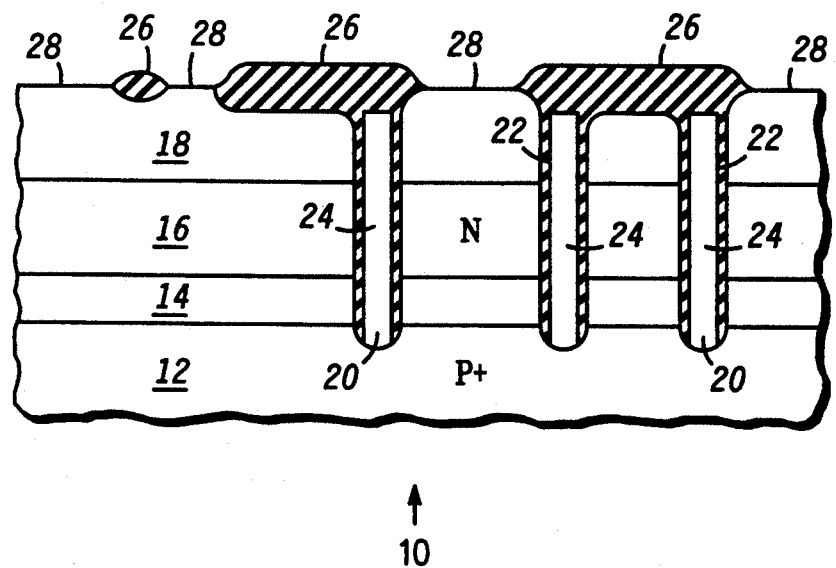
FIG. 1
FIG. 2
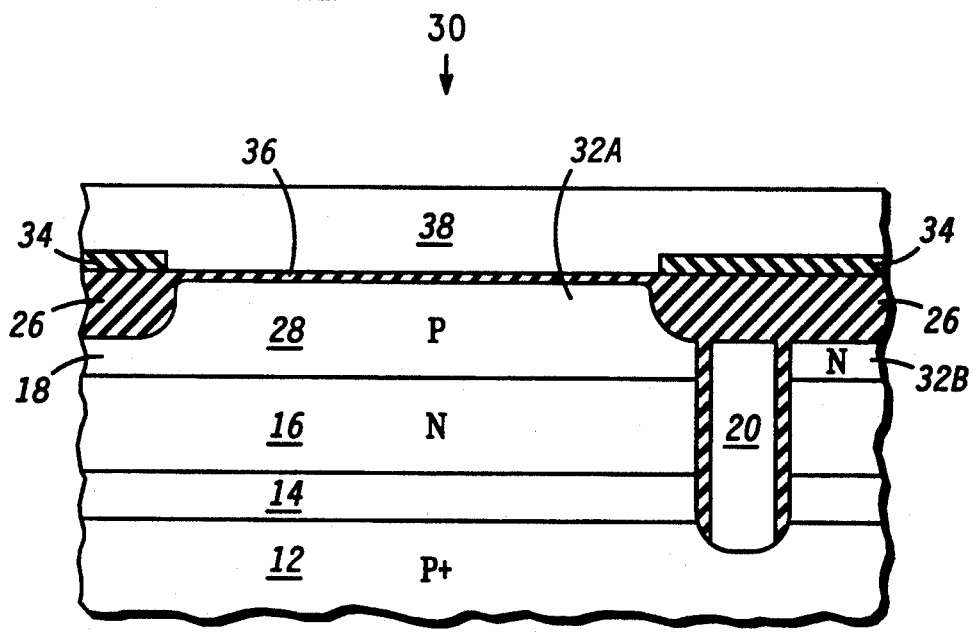

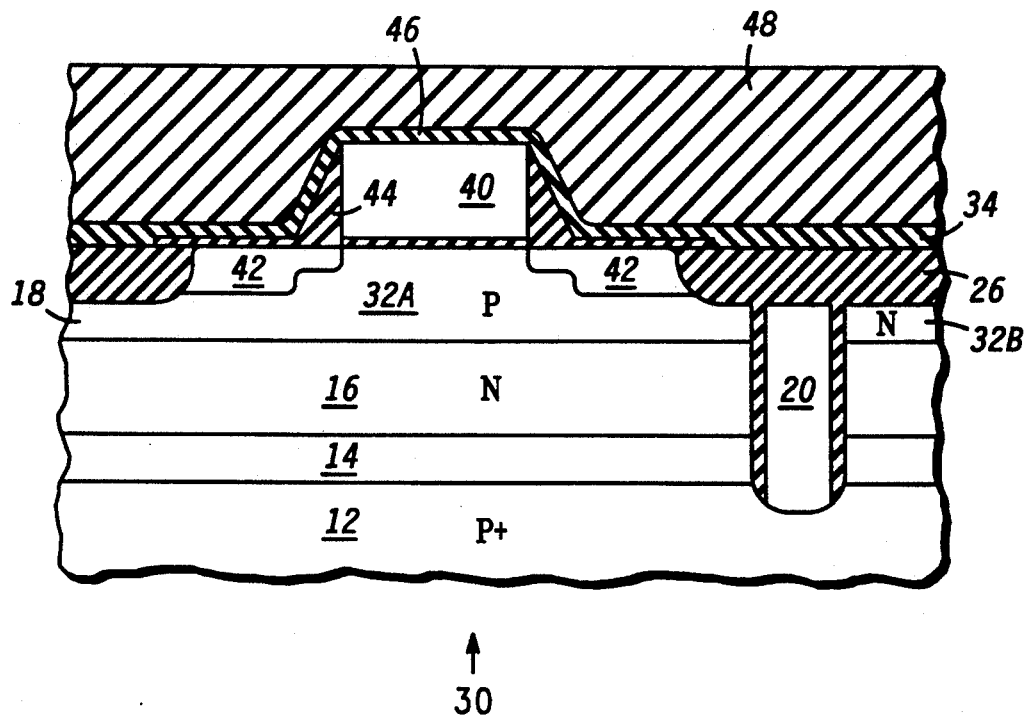
FIG. 3
FIG. 4
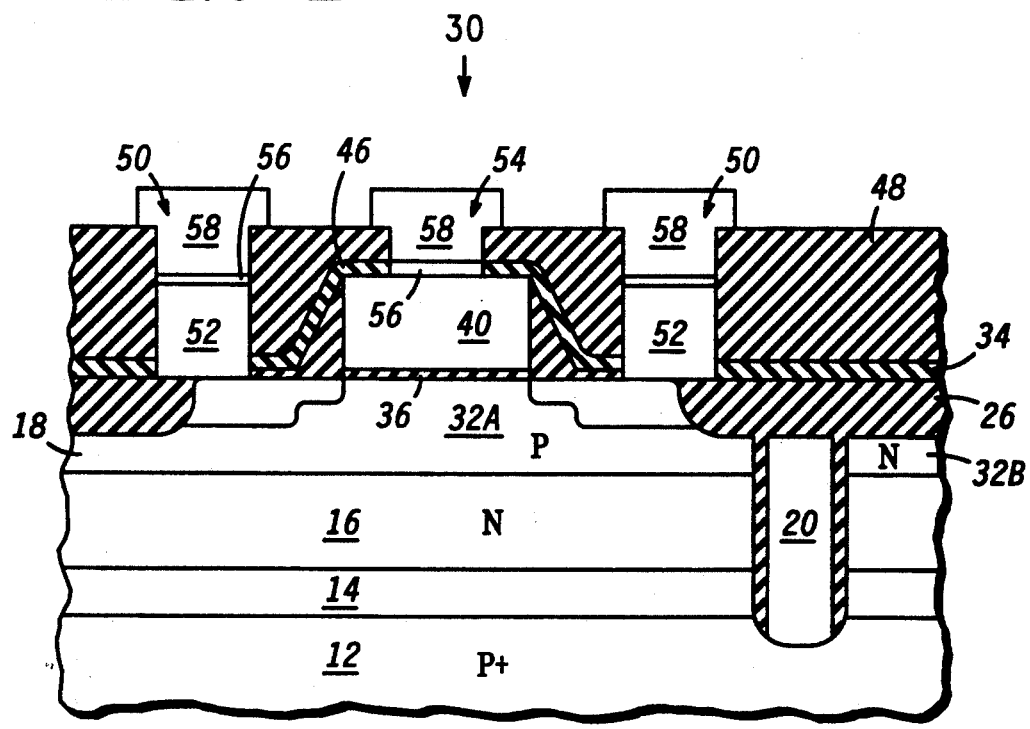

CMOS STRUCTURE FABRICATION

This application is a continuation of prior application Ser. No. 07/588,867, filed Sep. 27, 1990, now abandoned.

BACKGROUND OF THE INVENTION

This invention relates, in general, to semiconductor devices, and more particularly to the fabrication of CMOS devices which may be integrated into a BICMOS process.

A major trend in the semiconductor art is towards the fabrication of circuits integrating devices of multiple technologies. For example, a BICMOS integrated circuit which contains both bipolar and CMOS devices is highly desirable because the best characteristics of both technologies may be obtained and superior high performance integrated circuits may be fabricated.

There have been many problems associated with the integration of bipolar and CMOS devices into a single circuit. It is generally impractical to fabricate CMOS devices in a traditionally bipolar structure and vice versa. Many attempts at doing so have resulted in circuits having poor performance and requiring large amounts of real estate. Accordingly, the practical fabrication of BICMOS integrated circuits must have process integration flexibility as well as enhanced scalability characteristics.

In view of the above, it would be highly desirable to have a method of fabricating a CMOS structure that could be easily integrated into a BICMOS process.

SUMMARY OF THE INVENTION

Accordingly, it is an object of the present invention to provide a method of fabricating a CMOS structure that may be integrated into a BICMOS process.

Another object of this invention is to provide a method of fabricating a CMOS structure having process integration flexibility.

It is an additional object of the present invention to provide a method of fabricating a CMOS structure having excellent scalability characteristics.

The foregoing and other objects and advantages are achieved in the present invention by one embodiment in which, as a part thereof, includes providing an isolation module having a plurality of active device regions in which at least one N doped well and at least one P doped well are formed. A first conformal nitride layer is formed over the surface of the structure and portions thereof disposed over the doped wells are removed. Gate oxide is formed above the exposed doped wells prior to forming a conformal polycrystalline semiconductor layer on the surface of the structure. The conformal polycrystalline semiconductor layer is then doped so that it comprises a P conductivity type where disposed above an N doped well and an N conductivity type were disposed above a P doped well. Gate electrodes are then formed from the conformal polycrystalline semiconductor layer and are employed in the self-aligned formation of first portions of source and drain regions in the doped well. Once these first portions have been formed, dielectric spacers abutting the edges of the gate electrodes are formed and used in the self-aligned formation of second portions of the source and drain regions. A second conformal nitride layer is then formed on the surface of the structure and a conformal oxide layer is formed on the second conformal nitride layer. Source and drain contacts are then fabricated.

A more complete understanding of the present invention can be attained by considering the following detailed description in conjunction with the accompanying drawings.

BRIEF DESCRIPTION OF THE DRAWINGS

FIG. 1 is a highly enlarged cross-sectional view of a portion of an isolation module of the type to be used in conjunction with the present invention; and FIGS. 2-4 are highly enlarged cross-sectional views of a portion of a CMOS structure during processing.

DETAILED DESCRIPTION OF THE INVENTION

FIG. 1 is a highly enlarged cross-sectional view of an isolation module 10 of the type to be used in conjunction with the present invention. Although isolation module 10 as depicted herein comprises specific materials, conductivity types and dopant concentrations, it should be understood that these may vary. The fabrication of isolation module 10 may be in accordance with the method disclosed and taught by copending U.S. patent application Ser. No. 07/431,420, now U.S. Pat. No. 4,994,406 entitled "Method of Fabricating Semiconductor Structures" filed on Nov. 3, 1989 by B. Vasquez and P. Zdebel. It should be understood that the invention may also be employed with other type isolation modules or structures.

Isolation module 10 comprises a monocrystalline silicon substrate 12 having a P+ conductivity type and a dopant concentration of approximately $2 \times 10^{16}$ to $2 \times 10^{17}$ atoms/cm$^3$. An epitaxial silicon layer 14 is formed on substrate 12. Epitaxial layer 14 may be either N type or P type and in this embodiment, has a relatively low dopant concentration on the order of $1 \times 10^{14}$ atoms/cm$^3$. A maskless buried layer 16 is formed on epitaxial silicon layer 14. Buried layer 16 comprises epitaxial silicon, has an N conductivity type and a peak dopant concentration on the order of $3 \times 10^{19}$ to $4 \times 10^{19}$ atoms/cm$^3$. An epitaxial silicon layer 18 is formed on buried layer 16. Epitaxial layer 18 is approximately one micron thick, may be either N type or P type and has a dopant concentration on the order of $5 \times 10^{15}$ atoms/cm$^3$. Generally, active devices will be formed in epitaxial layer 18 of isolation module 10.

A plurality of isolation trenches 20 are formed through epitaxial layer 18, buried layer 16, epitaxial layer 14 and extend into substrate 12. Trenches 20 are lined with a trench liner oxide 22 and filled with polysilicon 24. Field oxide regions 26 are formed on the surface of isolation module 10 and with isolation tenches 20, generally separate and insulate active device regions 28 where the semiconductor devices will be formed.

FIGS. 2-4 are highly enlarged cross-sectional views of a portion of a CMOS transistor structure 30 during fabrication in accordance with the present invention. Although the fabrication of basically only a single transistor is depicted by these FIGS., it should be understood that the present invention is intended to fabricate CMOS structures and more specifically, integrating a CMOS process into a BICMOS process flow.

Now referring specifically to FIG. 2. After forming a screen oxide layer (not shown) on active device regions 28, epitaxial silicon layer 18 of active device regions 28 is doped to form doped wells 32. A P doped well 32A is formed by implanting a P type dopant such as boron into epitaxial silicon layer 18 of active device region 28. This will allow for the formation of an N channel device. An N doped well 32B is then formed by implanting an N type dopant such as phosphorous into epitaxial silicon layer 18 of other active device regions 28 where P channel devices are desired. Doped wells 32 may be formed by either a single implant or by multiple implants with staged energies and implant doses. Doped wells 32 may either be driven simultaneously or separately between implanting P type and N type dopants. Optimally, the surface concentration of P doped well 32A will be on the Order of $5 \times 10^{16}$ atoms/cm$^3$ and the surface concentration of N doped well 32B will be on the order of $8 \times 10^{16}$ atoms/cm$^3$.

Following the formation of doped wells 32, a first conformal nitride layer 34 is deposited over the entire surface of structure 30. It should be understood that first conformal nitride layer 34 is deposited over the entire surface of isolation module 10 (see FIG. 1) in a BICMOS process flow. In a preferred embodiment, first conformal nitride layer 34 will have a thickness of approximately 500 angstroms. After its formation, first conformal nitride layer 34 is masked and its portions disposed above doped wells 32 are etched from the surface of structure 30. The mask should slightly overlap onto field oxide regions 26 so that they become partially exposed after the portions of first conformal nitride layer 34 are etched away.

Once first conformal nitride layer 34 has been etched as desired, the screen oxide layer (not shown) is removed from above doped wells 32. This oxide etch may be performed by many methods well known in the art although a wet etch employing hydrofluoric acid is preferably employed. Following the removal of the screen oxide layer (not shown), a gate oxide layer 36 having a thickness in the range of 100 to 150 angstroms is grown over doped wells 32. Gate oxide layer 36 is thermally grown in this embodiment although it may be formed by other methods.

After the formation of gate oxide layer 36, a conformal polysilicon layer 38 is formed on the surface of structure 30. It should be understood that in the entire BICMOS process, conformal polysilicon layer 38 would be formed over the entire surface of isolation module 10 (See FIG. 1). Initially, a first portion of conformal polysilicon layer 38 comprising approximately 500 angstroms is formed immediately after the formation of gate oxide layer 36. This first portion of conformal polysilicon layer 38 satisfies boundary states. Threshold implants are then performed through the first portion of conformal polysilicon layer 38 and gate oxide layer 36 into doped wells 32. Once these threshold implants have been performed, additional polysilicon is formed on conformal polysilicon layer 38 so that its total thickness is approximately 3000 angstroms. It should be understood that conformal polysilicon layer 38 will form the resistors and base electrodes of bipolar devices fabricated by the BICMOS process as well as the CMOS gate electrodes which will be explained presently.

Now referring specifically to FIG. 3. Conformal polysilicon layer 38 is doped following its formation. In MOS structure 30, the portions of conformal polysilicon layer 38 which will become gate electrodes are appropriately doped. In the entire BICMOS process flow, the portions of conformal polysilicon layer 38 which will become the resistors and base electrodes in the bipolar devices are also appropriately doped at this time. Conformal polysilicon layer 38 is masked and etched following its doping. On MOS structure 30, a doped gate electrode 40 is formed from conformal polysilicon layer 38. Doped resistors and base electrodes are formed by etching conformal polysilicon layer 38 in the bipolar regions of isolation module 10 (see FIG. 1). The etching of conformal polysilicon layer 38 is preferably performed by reactive ion etching although other types of etching may be employed.

Once gate electrode 40 has been etched from conformal polysilicon layer 38, source and drain regions 42 which are interchangeable in this structure are formed. Initially, first portions of source and drain regions 42 are implanted. The implant is self-aligned to gate electrode 40. Following the implantation of the first portions of source and drain regions 42, sidewall spacers 44 abutting gate electrode 40 are formed. The formation of spacers 44 is consistent with methods well known in the art including the formation of a conformal oxide or nitride layer in a low temperature deposition process such as PECVD from which spacers 44 are etched. The formation of spacers 44 may be done simultaneously with the formation of spacers abutting the resistors and base electrodes of the bipolar devices in a BICMOS process flow. Once sidewall spacers 44 have been formed abutting gate electrode 40, second portions of source and drain regions 42 are implanted. This implant is self-aligned to sidewall spacers 44.

The device depicted in structure 30 will comprise N type source and drain regions 42 because doped well 32A is P type. N type source and drain regions 42 are formed by implanting arsenic or another N dopant into doped well 32A as described above. In an MOS device where doped well 32 is of an N conductivity type, source and drain regions 42 would be of a P conductivity type and formed by implanting boron or another P type dopant.

Following the formation of source and drain regions 42, a conformal nitride layer 46 is formed on the surface of structure 30. Conformal nitride layer 46 is approximately 500 angstroms thick and forms an ion contamination barrier over structure 30. A low temperature oxide layer 48 is then deposited on nitride layer 46 over the entire surface of structure 30. Once deposited, oxide layer 48 is then planarized over gate regions 40. A maskless planarizing etch is employed in this embodiment.

After the deposition and planarization of oxide layer 48, the fabrication of the emitter-base structure of the bipolar device is the next step to occur in the BICMOS process. The fabrication of the emitter-base structure is set forth in copending application Ser. No. 07/382,879, now U.S. Pat. No. 5,026,663 entitled "Method of Fabricating a Structure Having Self-Aligned Diffused Junctions" filed on Jul. 21, 1989 by P. Zdebel and B. Vasquez.

Now refering specifically to FIG. 4. Once the bipolar emitter-base structure has been fabricated, source and drain contacts are formed for the CMOS devices. Initially, source and drain contact openings 50 are formed through oxide layer 48, nitride layers 46 and 34 and gate oxide layer 36. The openings extend to epitaxial silicon layer 18. Source and drain contact openings 50 are formed simultaneously with collector contact openings for the bipolar devices in the BICMOS process. Once openings 50 have been etched, they are filled with contact polysilicon 52 which is planarized and recessed so that the top surface of polysilicon 52 is below the top surface of oxide layer 48. Where contact polysilicon 52 is formed to contact source and drain regions 42 of a device having a P type doped well 32A, it will be doped with an N type dopant such as arsenic. Where contact polysilicon 52 contacts the source and drain regions of a device having an N type doped well 32B it will be doped with a P type dopant such as boron. If contact polysilicon 52 is desired to contact doped wells 32A and 32B, its conductivity type must be the same as the well it contacts. It should be understood that the formation of contact polysilicon 52 is performed simultaneously with the formation of polysilicon to contact the collectors and emitters of the bipolar devices in the BICMOS process.

Once contact polysilicon 52 has been formed and doped, a gate electrode contact opening 54 is formed by etching through oxide layer 48 and nitride layer 46 to expose polysilicon gate electrode 40. In the BICMOS process, contact openings to the polysilicon resistors and base electrodes of the bipolar devices are also formed at this time. Silicide 56 is formed on all exposed polysilicon including gate electrode 40 and contact polysilicon 52 of structure 30 as well as the polysilicon exposed on the bipolar structure. Once silicide 56 has been formed, contact metal 58 is formed on silicide 56. The formation of silicide 56 and contact metal 58 is by methods well known in the art.

Thus is is apparent that there has been provided, in accordance with the invention, an improved method of fabricating a CMOS structure that may be integrated into a BICMOS process flow. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention

What is claimed is:

1. A method of fabricating a CMOS structure comprising the steps of:
   providing an isolation module having a plurality of active device regions;
   forming doped wells in at least some of said active device regions, at least one of said wells having an N conductivity type and at least one of said wells having a P conductivity type;
   forming a first conformal nitride layer on the surface of the structure;
   removing portions of said first conformal nitride layer from above said doped wells;
   forming a gate oxide layer on said doped wells where said portions of said first conformal nitride layer was previously disposed;
   forming a conformal polycrystalline semiconductor layer on the surface of the structure;
   doping said conformal polycrystalline semiconductor layer so that it has a P conductivity type where disposed above said at least one N doped well and an N conductivity type where disposed above said at least one P doped well;
   forming gate electrodes from said doped conformal polycrystalline semiconductor layer;
   forming first portions of source and drain regions in said doped wells, the formation being self-aligned to said gate electrodes;
   forming dielectric spacers abutting the edges of said gate electrodes;
   forming second portions of said source and drain regions, the formation being self-aligned to said dielectric spacers;
   forming a second conformal nitride layer on the surface of the structure including said gate electrodes and said dielectric spacers;
   forming a conformal oxide layer on said second conformal nitride layer; and
   forming source and drain contacts.

2. The method of claim 1 wherein the isolation module comprises:
   a monocrystalline silicon substrate of a first conductivity type;
   a relatively low doped epitaxial silicon layer of one of first and second conductivity types disposed on said substrate;
   an epitaxial silicon buried layer having a relatively high dopant concentration of the second conductivity type disposed on said relatively low doped layer;
   a well epitaxial silicon layer of one of the first and second conductivity types disposed on said buried layer;
   a plurality of filled isolation trenches extending into said substrate;
   field oxide regions disposed on the surface of said well layer; and
   active device regions disposed between said field oxide regions.

3. The method of claim 1 wherein the forming doped wells step is performed by either a single implant or multiple implants with staged energies and implant doses.

4. The method of claim 1 wherein the forming a conformal polycrystalline semiconductor layer includes depositing a first conformal silicon layer and depositing a second conformal silicon layer on said first conformal silicon layer.

5. The method of claim 4 wherein threshold implants into the doped wells are performed between depositing the first conformal silicon layer and the second conformal silicon layer.

6. The method of claim 1 wherein the forming dielectric spacers step includes forming oxide or nitride spacers by PECVD.

7. The method of claim 1 wherein the forming source and drain contacts step comprises:
   forming source and drain contact openings extending to the surface of the isolation module;
   forming polycrystalline semiconductor material in said openings so that the top surface of said semiconductor material is recessed below the top surface of the conformal oxide layer;
   doping said semiconductor material in said openings;
   forming silicide on said semiconductor material in said openings; and
   forming contact metal on said silicide.

8. A method of fabricating a CMOS structure comprising the steps of:
   providing an isolation module having a plurality of active device regions;
   forming a screen oxide layer over said plurality of active device regions;
   implanting dopant into at least some of said plurality of active device regions to form doped wells, at least one of said doped wells having an N conductivity type and at least one of said wells having a P conductivity type;

depositing a first conformal nitride layer on the surface of the structure;
removing portions of said first conformal nitride layer from above said doped wells;
removing said screen oxide layer;
growing a gate oxide layer on said doped wells where said portions of said first conformal nitride layer were formerly disposed;
depositing a first conformal polysilicon layer on the surface of the structure;
performing threshold implants into said doped wells;
depositing a second conformal polysilicon layer on said first conformal polysilicon layer;
doping said first and second conformal polysilicon layers so that they have a P conductivity type where disposed above said at least one N doped well and an N conductivity type where disposed above said at least one P doped well;
etching gate electrodes from said first and second doped conformal polysilicon layers;
implanting first portions of source and drain regions in said doped wells, the implanting being self-aligned to said gate electrodes;
forming dielectric spacers abutting the edges of said gate electrodes;
implanting second portions of said source and drain regions, the implanting being self-aligned to said dielectric spacers;
depositing a second conformal nitride layer on the surface of the structure including said gate electrodes and said dielectric spacers;
depositing a conformal oxide layer on said second conformal nitride layer; and
forming source and drain contacts.

9. The method of claim 8 wherein the isolation module comprises:
a monocrystalline silicon substrate of a first conductivity type;
a relatively low doped epitaxial silicon layer of one of first and second conductivity types disposed on said substrate;
an epitaxial silicon buried layer of the second conductivity type having a relatively high dopant concentration disposed on said relatively low dopant layer;
a well epitaxial silicon layer of one of the first and second conductivity types disposed on said buried layer;
a plurality of filled isolation trenches extending into said substrate;
field oxide regions disposed on the surface of said well layer; and
active device regions disposed between said field oxide regions.

10. The method of claim 9 wherein the implanting dopant step includes performing a single implant or multiple implants with staged energies and implant doses.

11. The method of claim 10 wherein the forming dielectric spacers step includes forming oxide or nitride spacers by PECVD.

12. The method of claim 11 wherein the forming source and drain contacts step comprises:
forming source and drain contact openings extending to the surface of the isolation module;
forming polysilicon in second openings so that the top surface of said polysilicon is recessed below the top surface of the conformal oxide layer;
doping said polysilicon in said openings;
forming silicide on said polysilicon in said openings; and
forming contact metal on said silicide.

13. The method of claim 12 wherein the doping said polysilicon in said opening step includes doping the polysilicon disposed over the at least one N doped well with a P type dopant and doping the polysilicon disposed over the at least one P doped well with an N type dopant.

14. A method of integrating CMOS devices into a BiCMOS structure comprising the steps of:
providing an isolation module having a plurality of active device regions;
forming a screen oxide layer over said plurality of active device regions;
implanting dopant into at least some of said plurality of active device regions to form doped wells, said implanting being either single implants or multiple implants with staged energies and implant doses and at least one doped well having an N conductivity type and at least one doped well having a P conductivity type;
depositing a first conformal nitride layer on the surface of the structure;
removing portions of said first conformal nitride layer from above said doped wells;
removing said screen oxide layer;
growing a gate oxide layer on said doped wells where said portions of said first conformal nitride layer were formerly disposed;
depositing a first conformal polysilicon layer on the surface of the structure;
performing threshold implants into said doped wells through said first conformal polysilicon layer and said gate oxide layer;
depositing a second conformal polysilicon layer on said first conformal polysilicon layer;
doping said first and second conformal polysilicon layers to have a P conductivity type where disposed above said at least one N doped well and an N conductivity type where disposed above said at least one P doped well;
etching gate electrodes from said first and second doped conformal polysilicon layers;
implanting first portions of source and drain regions in said doped wells, the implant being self-aligned to said gate electrodes;
forming dielectric spacers abutting the edges of said gate electrodes;
implanting second portions of said source and drain regions, the implant being self-aligned to said dielectric spacers;
depositing a second conformal nitride layer on the surface of the structure including said gate electrodes and said dielectric spacers;
depositing a conformal oxide layer on said second conformal nitride layer;
planarizing said conformal oxide layer; and
forming source and drain contacts.

15. The method of claim 14 wherein the isolation module comprises:
a monocrystalline silicon substrate of a first conductivity type
a relatively low doped epitaxial silicon layer of one of first and second conductivity types disposed on said substrate;

an epitaxial silicon buried layer of the second conductivity type having a relatively high dopant concentration and disposed on said relatively low doped layer;

a well epitaxial silicon layer of one of the first and second conductivity types disposed on said buried layer;

a plurality of filled isolation trenches extending into said substrate;

field oxide regions disposed on the surface of said well layer; and active device regions disposed between said field oxide regions.

16. The method of claim 15 wherein the doping said first and second conformal polysilicon layers step further includes doping said first and second conformal polysilicon layers in the regions disposed over active device regions to have bipolar devices formed therein.

17. The method of claim 16 wherein the etching gate electrodes step is performed simultaneously with etching resistors and base electrodes for bipolar devices from the first and second doped conformal polysilicon layers.

18. The method of claim 17 wherein the forming dielectric spacers step further includes forming dielectric spacers abutting the edges of the resistors and base electrodes of the bipolar devices.

19. The method of claim 18 wherein the forming source and drain contacts step comprises:

forming source and drain contact openings extending to the surface of the isolation module;

forming polysilicon in said openings so that the top surface of said polysilicon is recessed below the top surface of the conformal oxide layer;

doping said polysilicon in said openings so that said polysilicon disposed over the at least one N doped well is P type and said polysilicon disposed over the at least one P doped well is N type;

forming silicide on said polysilicon in said openings; and forming contact metal on said silicide.

20. The method of claim 19 wherein the forming source and drain contact openings step is performed simultaneously with forming collector and emitter contact openings for the bipolar devices.

21. The method of claim 20 wherein the forming polysilicon in said openings is performed simultaneously with forming polysilicon in the collector and emitter openings of the bipolar devices.

22. The method of claim 17 wherein the conformal oxide layer is at least partially removed from the surfaces of the gate electrodes as well as the polysilicon resistors and base electrodes of the bipolar devices following the doping said polysilicon step and the forming silicide and forming contact metal steps include forming silicide and contact metal on said gate electrodes of the CMOS devices and said polysilicon resistors and said base electrodes of the bipolar devices.

* * * * *